United States Patent
Kurrer et al.

[11] Patent Number: 6,137,052
[45] Date of Patent: Oct. 24, 2000

[54] SHIELDED MOUNTING RACK FOR ELECTRICAL PRINTED CIRCUIT BOARD ASSEMBLIES PROVIDED WITH A SPRING CONDUCTIVE STRIP

[75] Inventors: Siegfried Kurrer, Nuremberg; Werner Koerber, Betzenstein; Ralf Behrens, Nuremberg; Kurt-Michael Schaffer, Eckental, all of Germany

[73] Assignee: Siemens Aktiengesellschaft, Munich, Germany

[21] Appl. No.: 09/309,273

[22] Filed: May 11, 1999

Related U.S. Application Data

[63] Continuation of application No. PCT/DE97/00758, Apr. 16, 1997.

[30] Foreign Application Priority Data

Nov. 11, 1996 [DE] Germany .................. 296 19 565 U

[51] Int. Cl.[7] ........................................ H05K 9/00
[52] U.S. Cl. ............................. 174/35 GC; 361/800; 361/802; 361/816
[58] Field of Search .............. 174/35 R, 35 GC; 361/800, 816, 818, 753, 802, 727, 740, 756, 799

[56] References Cited

U.S. PATENT DOCUMENTS 4,631,641 12/1986 Brombal et al. .
5,250,751 10/1993 Yamaguchi .................. 174/35 GC

FOREIGN PATENT DOCUMENTS

| 3604860 A1 | 8/1987 | Germany . |
| 29602426 U1 | 5/1996 | Germany . |
| 19523257 C1 | 12/1996 | Germany . |
| 29618625 U1 | 1/1997 | Germany . |

*Primary Examiner*—Dean A. Reichard
*Assistant Examiner*—Hung V Ngo
*Attorney, Agent, or Firm*—Sughrue, Mion, Zinn, Macpeak & Seas, PLLC

[57] ABSTRACT

The mounting rack contains transverse rails (1, 31), at least one front element (29), and at least one spring contact strip (10; 38). The contact strip has a retaining portion (11) for fitting on an end face (21, 22) of the transverse rail and contact springs (14) which are connected to the retaining portion and have spring limbs (15) which are angled off in a direction away from the interior of the mounting rack, such that these spring limbs (15) extend in a direction generally coincident with the longitudinal side (54) of the front element the spring movements of the spring limbs (15) are generally in the same direction as the insertion and withdrawal movements (24, 48) for the printed circuit board assembly fastened to the front element.

21 Claims, 7 Drawing Sheets

SHIELDED MOUNTING RACK FOR ELECTRICAL PRINTED CIRCUIT BOARD ASSEMBLIES PROVIDED WITH A SPRING CONDUCTIVE STRIP

This is a Continuation of International Application PCT/DE97/00758, with an international filing date of Apr. 16, 1997, the disclosure of which is incorporated into this application by reference.

FIELD OF AND BACKGROUND OF THE INVENTION

The invention relates to new and useful improvements to a shielded mounting rack for electrical printed circuit board assemblies. More particularly, the invention relates to a mounting rack for electrical printed circuit boards whose basic design as a rule includes two side wall plates that are connected to one another by transverse rails. The front and rear of the mounting rack are each formed by a pair of upper and lower transverse rails. Mutually opposite pairs of guide rails are latched into these transverse rails to form so-called installation slots. The printed circuit boards, also called printed circuit board assemblies, can be inserted into these slots, parallel to one another and each oriented vertically.

As a rule, the printed circuit boards have a so-called front panel which covers a front face of the printed circuit board and is used as the retaining surface for a wide range of display, control and contact elements. The front panels of printed circuit boards that have been pushed vertically into a mounting rack next to one another then form a virtually continuous surface, covering the front of the mounting rack.

To achieve electromagnetic shielding, printed circuit board front panels are generally manufactured from an electrically conductive material, or are at least covered by such a material.

German Laid Open Publication DE 36 04 860 C2 and U.S. Pat. No. 4,631,641 both disclose arrangements for radio-frequency screening of front panels located vertically next to one another on the front of a mounting rack. These front panels are electrically conductively connected to one another via vertical spring contact strips. This allows the vertical grooves on the front of a mounting rack to be effectively shielded against the ingress and emission of electromagnetic interference.

One problem associated with such electromagnetic shielding arises at the lower and upper narrow sides of each front panel. As a rule, there are admittedly generally mounting screws at these points, so that the front panels can be screwed, for example, to rails with threaded holes in them. These rails are inserted into transversely running retaining grooves on the fronts of the lower and upper transverse rails of the mounting rack. Furthermore, these mounting screws allow an electrically conductive connection to be made between the ends of each of the front panels and the mounting rack frame, via its transverse rails. However, these are only point contacts and do not extend over the entire width of the associated front panels. Particularly if the printed circuit board assemblies have broad front panels and occupy a volume of more than one standard unit inside the mounting rack, such an electrically conductive point contact between the front panel and the mounting rack transverse rails running behind its ends is inadequate for reliable electromagnetic shielding.

The same problem also arises with covering panels, for example on the rear of mounting racks. Once again, these generally make only point contact via screws with the transverse rails extending along the top and bottom of the rear of the mounting rack.

In this context, German Patent DE 195 23 257 C1, which was published after the original filing date of the present application, discloses a mounting rack in which the metallic or metallized front panels of the assemblies are conductively connected to the front profiled rails by means of leaf springs. Each leaf spring has a fixing part which is attached to a limb (forming a groove) of the profiled rail. The leaf springs themselves have resilient parts, thus allowing electrical contact to be made between the front panel and the profiled rail upon insertion.

German Utility Model DE 296 18 625 U1 discloses another shielded mounting rack. The module rails of this rack each have an upper and a lower engagement groove located behind the rail's bearing surface. Spring contact strips are provided which can be snapped onto the bearing surfaces and latch elastically into the engagement grooves, thereby engaging behind the bearing surfaces. The spring contact strips have a number of punch-outs which point toward the front of the mounting rack and are resilient, as well as a number of contact claws pointing toward the bearing surface.

The spring contact strips on conventional shielded mounting racks cannot completely overcome the problem of damage potentially caused by wear, particularly if pressure beyond that from the contact with the front panels is exerted on the contact springs of the spring strips. Gripping levers are sometimes fitted to the longitudinal ends of the front panels of the assemblies, to allow the associated assembly to be levered out of the mounting rack. These levers in particular exert considerable point bending forces on the spring contact strips.

OBJECTS OF THE INVENTION

One object of the invention is therefore to develop a mounting rack such that electromagnetic contact is ensured between flat elements, particularly such as front panels of inserted printed circuit board assemblies and/or rear covering panels, and the lower and upper transverse rails on the front and/or rear of the mounting rack. Another object is to provide a mounting rack that provides good electromagnetic contact as described, even if the inserted spring contact strips are not always loaded over a large area by pressure exerted on the inner surfaces of front panels.

SUMMARY OF THE INVENTION

These and other objects are achieved by the teachings relating to mounting racks and spring contact strips according to the invention. According to one formulation, the invention provides a mounting rack for holding at least one electrical printed circuit board assembly, and includes: a) electrically conductive transverse rails provided at least on a front face of the mounting rack, between which rails the printed circuit board assembly is inserted; b) at least one electrically conductive front element connected to the printed circuit board assembly and having a longitudinal side extending in a longitudinal direction; and c) at least one spring contact strip. The spring contact strip includes: c1) at least one retaining portion securing the spring contact strip on an end face, facing the front element, of at least one of the transverse rails; and c2) at least one contact spring connected to the retaining portion and including a spring limb which is angled off from the retaining portion and which extends in a direction generally away from an interior of the mounting rack. The spring limb extends from the retaining portion additionally in generally the longitudinal direction of the longitudinal side of the front element. Furthermore, the spring limb exhibits spring movements in directions that approximately coincide respectively with directions of insertion and withdrawal movements of the printed circuit board assembly into and out of the mounting rack.

BRIEF DESCRIPTION OF THE DRAWINGS

The invention and further advantageous refinements of the invention according to the features of the dependent claims are explained in more detail below with the aid of diagrammatic, exemplary embodiments in the drawing, in which:

DETAILED DESCRIPTION OF THE PREFERRED EMBODIMENTS

Figure 1:
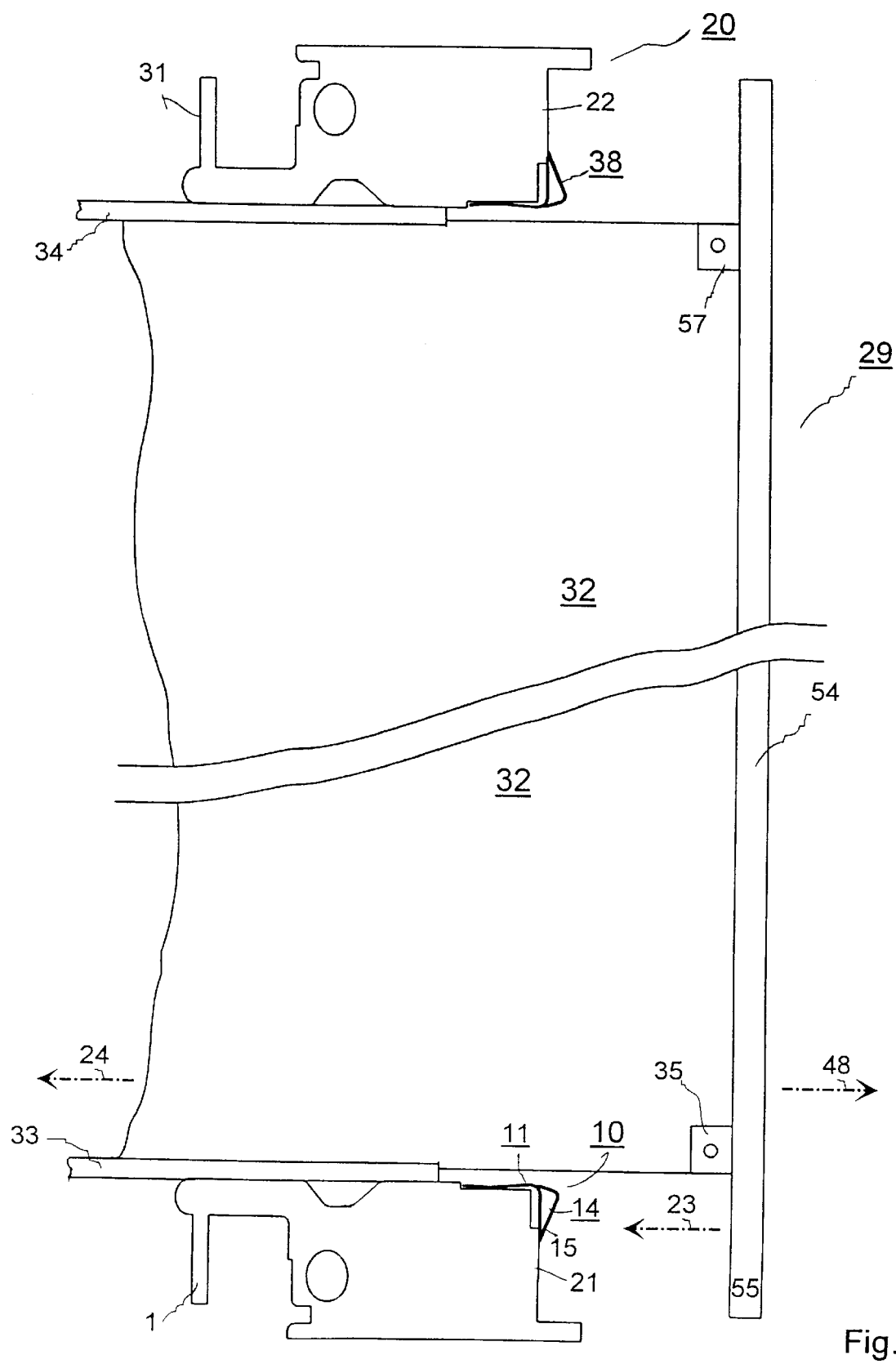
FIG. 1 shows a cross-section through a mounting rack, with a first embodiment of a front element for a printed circuit board assembly, wherein electromagnetic shielding, designed in accordance with the invention, of the ends of the front element, is provided in the region of the transverse rails.

FIG. 1 shows a cross-section through an example of a mounting rack, in the region of its front side 20, that is used to hold, particularly, electrical printed circuit board assemblies which can be inserted into the mounting rack vertically next to one another. These assemblies are generally printed circuit boards fitted with electrical components. The mounting rack has a lower transverse rail 1 arranged, by way of example, at the lower end of the front face 20 of the mounting rack. A corresponding upper transverse rail 31 is located at the upper end of the front face 20. These transverse rails are made of electrically conductive material, or are at least coated with such a material. Electrical printed circuit board assemblies can be inserted in the mounting rack, preferably vertically next to one another, between the transverse rails 1, 31, etc.

Furthermore, corresponding transverse rails can be arranged on the rear of the mounting rack (which is not illustrated in FIG. 1) and/or additionally arranged as so-called horizontal center transverse rails within the front and rear sides of a mounting rack. This allows the overall height of the mounting rack to be reduced so that printed circuit boards with a smaller insertion height can be inserted in the mounting rack as well.

By way of example, FIG. 1 shows a side view of the front element 29 of a printed circuit board assembly 32 that has already been partially inserted into the mounting rack. As noted above, the rack is made of electrically conductive material, or is at least coated with such a material. In the illustrated embodiment, the front element 29 has a front panel 54 which is connected to the printed circuit board assembly 32 via a mounting piece 35, 57 at each corner. A dashed directional arrow 24 indicates the direction of insertion movement, and the dashed arrow 48 indicates the direction of withdrawal movement of the electrical printed circuit board assembly 32 in the mounting rack. A guide rail 33, 34 is fitted in the insertion direction 24 on the side of each transverse rail 1, 31 that faces the inside of the mounting rack. These guide rails 33, 34 have grooves in which the edges of the printed circuit board assembly 32 can slide for insertion into and withdrawal from the mounting rack.

According to the invention, at least one spring contact strip is provided. A lower spring contact strip 10 and a correspondingly constructed upper spring contact strip 38 are provided in the example in FIG. 1. The following text explains the construction of a spring contact strip according to the invention, using the example of the lower spring contact strip 10 in FIG. 1. This contact strip 10 has retaining portion 11, which is used to fit the spring contact strip 10 on an end face 21 (facing the front 20 of the mounting rack) of the lower transverse rail 1. Electrically conductive contact is made between the spring contact strip 10 and the lower transverse rail 1. A corresponding spring contact strip 38 is fitted on the end face 22 of the upper transverse rail 31, likewise facing the front 20 of the mounting rack.

Figure 7:
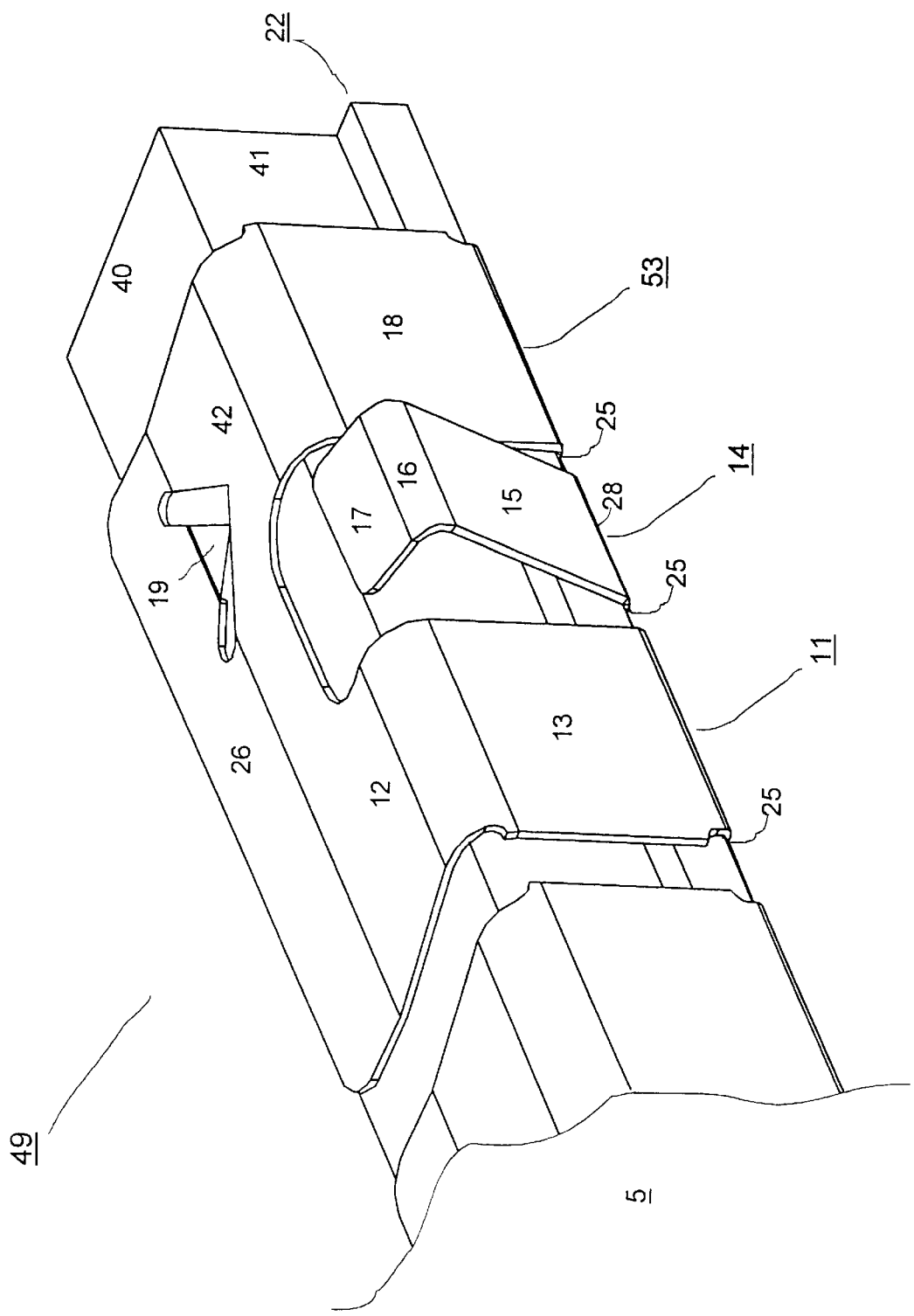
FIG. 7 shows a perspective plan view of a detail of a preferred embodiment of the spring contact strip shown in FIG. 6 and in accordance with the invention.

According to the invention, the spring contact strip 10 has at least one contact strip 14 which is connected to the retaining portion 11 and has spring limbs 15 which are angled in the direction of the outside 20 of the mounting rack, such that the spring limbs 15 extend roughly in the direction of the preferably vertically running longitudinal side 55 of the front element 29 of the printed circuit board assembly 32 (see also e.g., FIG. 7). The spring movements 23 of the spring limbs 15 run roughly in the direction of the insertion and withdrawal movements 24 and 48 of the printed circuit board assembly 32 into and out of the mounting rack.

When completely inserted, the electrical printed circuit board assembly 32 rests on the end faces 21, 22 of the lower and upper transverse rails 1, 31. This allows the front elements of the electrical printed circuit board assembly which have been pushed into the mounting rack next to one another to make uninterrupted, electrically conductive contact over their entire width with the respective transverse rail located behind them. This allows electromagnetic shielding of the mounting rack to be achieved even in the region of the ends of a front element on the transverse rails.

The configuration of the shielding with the spring contact strips according to the invention has the advantage that the preferred angling of the spring limbs eliminates concerns about any damage or destruction to the spring contact strips if forces other than the surface pressures from the insides of the front panel 54 of the front element 29 of the printed circuit board assembly 32 are exerted on them. In fact such a spring contact strip can also permanently compensate for pressures exerted, for example, when gripping levers are used to lever the printed circuit board assembly out and, in the process, are supported on the end faces 21, 22 of the transverse rails 1, 31. This will be explained in more detail below.

Figure 2:
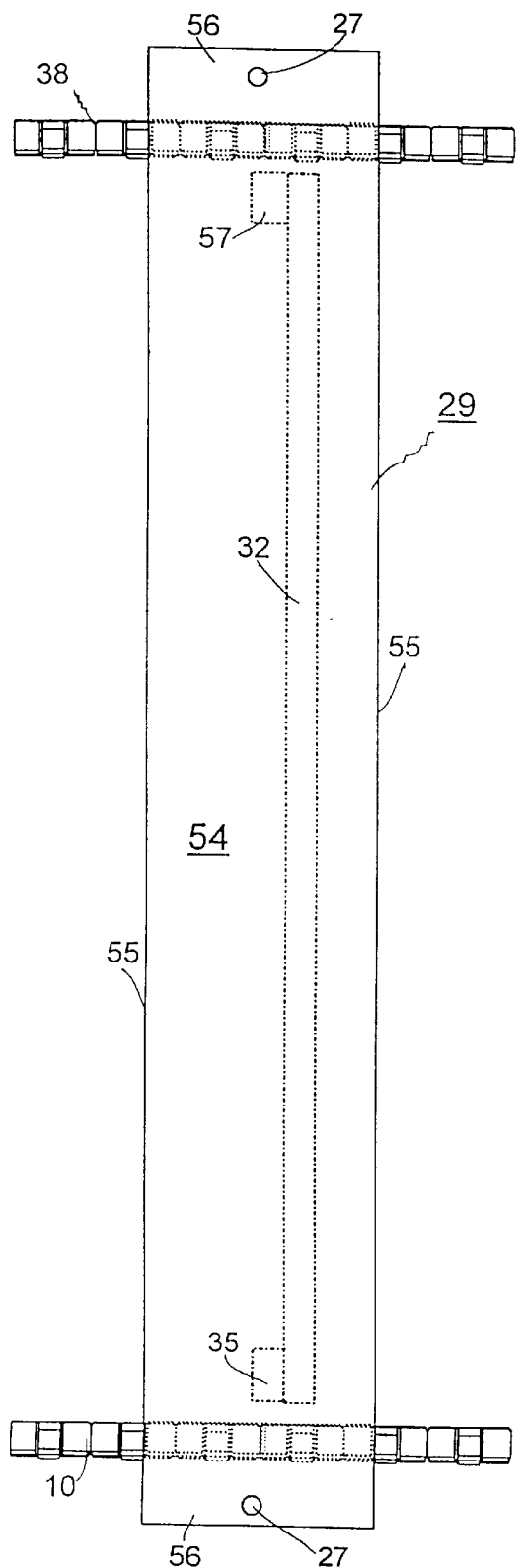
FIG. 2 shows a plan view of the front element as shown in the embodiment in FIG. 1.

FIG. 2 shows a plan view of the example of the front element 29 as shown in FIG. 1. As already stated, the front element 29 has an elongated front panel 54 with two, preferably vertically extending, longitudinal sides 55 and two short transverse sides 56, which run parallel to the transverse rails 1, 31. The front element 29 also includes a lower and an upper mounting piece 35, 57 in the corners, which are connected both to the interior side of the front panel 54 and to the corners of the electrical printed circuit board assembly 32. In FIG. 2, these parts located behind the front panel 54 are shown by dotted lines. Finally, FIG. 2 shows details of the upper and lower spring contact strips 10, 38. These spring contact strips 10, 58 rest against the end faces of the transverse rails 1, 31, which are not illustrated in FIG. 2 for the sake of clarity. Those parts of the spring contact strips 10, 38 which make contact on the rear side of the front panel 54 and thus are obscured by the front panel 54 are once again represented with phantom lines.

Figure 3:
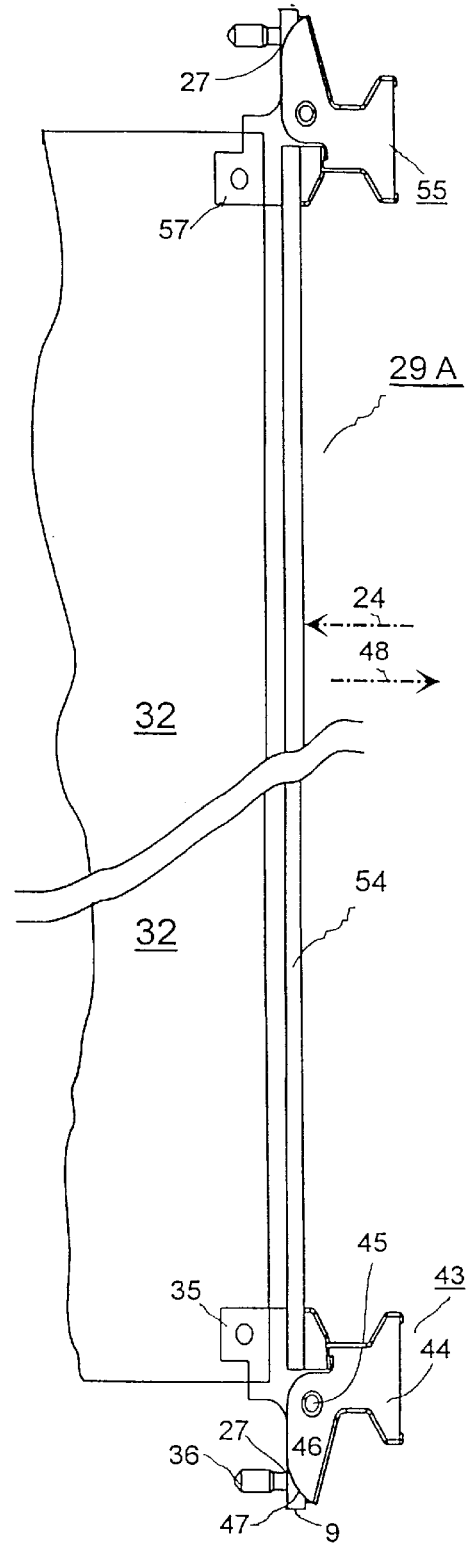
FIG. 3 shows a side view of a second embodiment of a front element of a printed circuit board assembly which can be inserted into a mounting rack in accordance with the invention.

FIG. 3 shows a side view of a second embodiment of a front element 29A for a printed circuit board assembly 32, which can be used in a mounting rack according to the invention. This front element 29A also contains gripping levers 43, 55, arranged in the region of the short transverse sides 56 on the longitudinal side ends 9 of the front panel 54. In the configuration shown, the mounting pieces 35, 57 at the corners are designed so that they are also used to hold the gripping levers 43, 55, which are rotatably mounted via bearing journals 45. The corner mounting pieces 35, 57 also have holes 27, into which retaining screws 36 are inserted.

The gripping levers 43, 55 in FIG. 3 have at least one grip 44, which can be operated by one person, and a supporting limb 46 on the upper side of the fulcrum 45. The supporting limbs 46 have at least one curved pressure surface 47, facing inward toward the mounting rack. If, for example, the lower gripping lever 43 is pressed downward in order to lever the printed circuit board assembly 32 out of the mounting rack, then the supporting limb 46 presses against the transverse rail located behind it, and in turn, on the spring contact strip 10 mounted on the transverse rail. The advantageous design of the spring contact strip 10 according to the invention allows the pressure surface 47 to roll on the spring contact strip, without damaging it. When the printed circuit board assembly is inserted, the contact strip 10 rests with an electrically conductive contact against the inwardly directed surface of the respective corner mounting piece 35, 57. This will be explained in more detail below, particularly with reference to FIGS. 6a, 6b and 6c.

Figure 4:
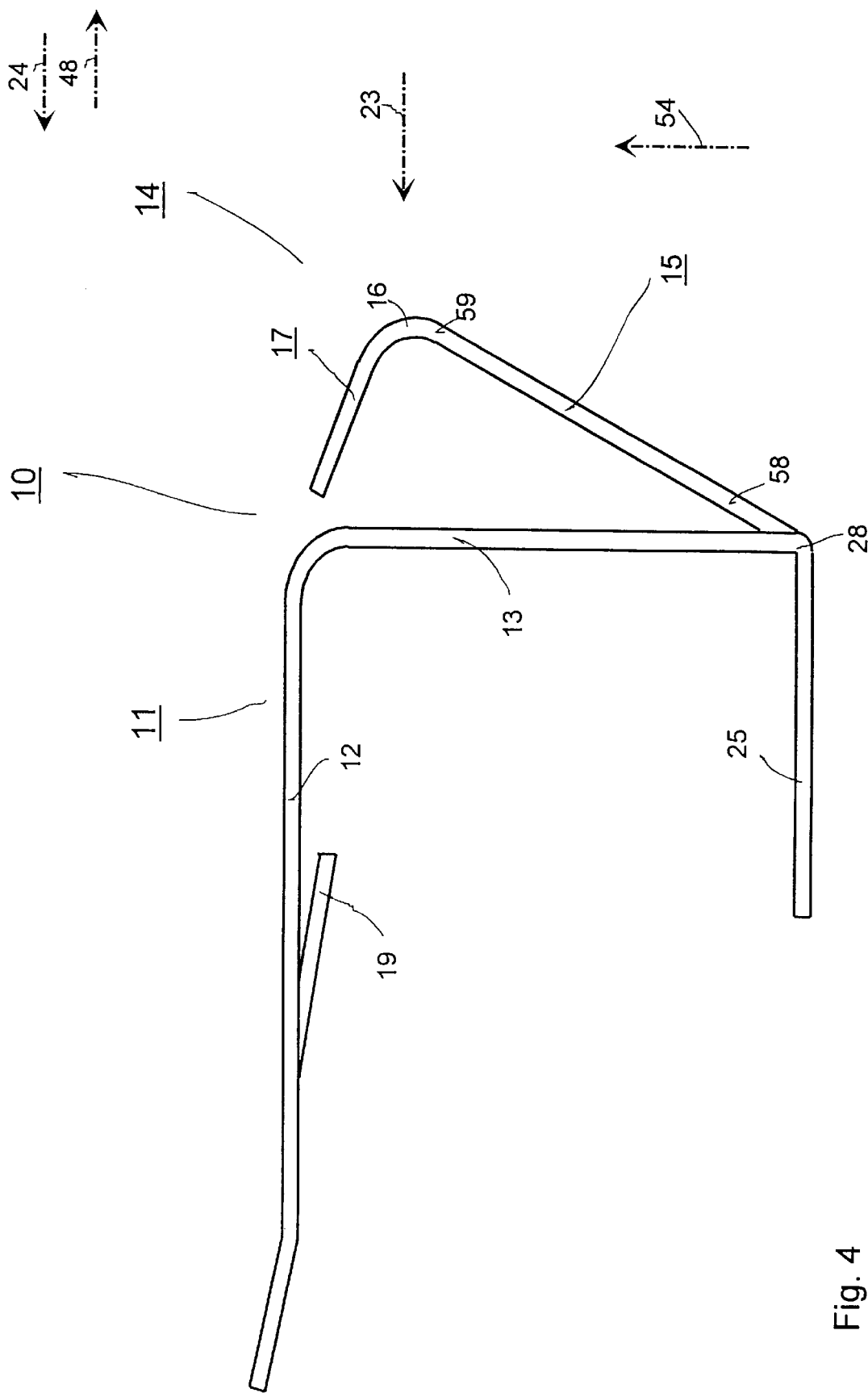
FIG. 4 shows a cross-section through a preferred embodiment of a spring contact strip according to the present invention.

FIG. 4 shows a cross-section through a preferred embodiment of a spring contact strip 10 according to the invention, including at least one retaining portion 11 and at least one contact spring 14. According to the invention, the spring limbs 15 extend roughly in the direction of the preferably vertically oriented longitudinal side 54 of the front element of a printed circuit board assembly. This is indicated in FIG. 4 by a dashed-dotted arrow with the reference number 54. According to the invention, the spring movement 23 of the spring limb 15 shown in FIG. 4 runs roughly in the direction of the insertion and withdrawal movements 24, 48 of printed circuit board assemblies into and out of the mounting rack. The spring movement 23 and the insertion and withdrawal movements 24, 48 are likewise represented by corresponding dash-dotted arrows in FIG. 4.

The preferred embodiment of the inventive spring limb 15 illustrated in FIG. 4 also has a first limb end 58, which faces the transverse rail of the mounting rack on which the retaining portion 11 is fitted. This limb end 58 is bent away from the retaining portion 11 along a longitudinal edge 28 that extends approximately parallel to the short transverse side 56 of a front element 29 and approximately parallel to the transverse rail connected to the retaining portion 11, for example the transverse rail 1 in FIG. 1. The preferred embodiment of the spring limb 15 illustrated in FIG. 4 also includes a second limb end 59 which is directed away from the transverse rail 1 and opens into a preferably curved contact region 16. Once a printed circuit board is inserted, this contact region 16 rests electrically conductively against the interior surface of the front element 29 of a printed circuit board assembly 32. A spring limb 15 advantageously also has a contact region extension 17, which is angled off from the second limb end 59 in the general direction of a transverse rail of the mounting rack, for example the transverse rail 1 in FIG. 1.

The retaining portions 11 of the spring contact strip are preferably each designed in a U-shape and can thus advantageously be plugged onto an end face (facing the front 20 of the mounting rack) of a transverse rail. This is explained in more detail below with reference to the example in FIG. 5. In the advantageous configuration of a spring contact strip 10 as shown in FIG. 4, the U-shaped retaining strip 11 has at least one bearing strip 25 with a longitudinal edge 28, along which the spring limbs 15 of the contact springs 14 are preferably bent back at the one limb end 58. The spring contact strip 10 is connected to the corresponding transverse rail, for example by bonding, at least via the bearing strip 25, which runs in the direction of the respective transverse rail of the mounting rack.

According to a further embodiment of the invention, which is also illustrated in FIG. 4, in particular in case the connection between the retaining portion 11 and the transverse rail is purely mechanical, for example by clamping, it is also advantageous for at least one connecting web 13 to be bent approximately at a right-angle away from the bearing strip 25. The connecting web 13 then rests against an end face 21 (facing the front 20 of the mounting rack) of the corresponding transverse rail 1. At least one additional terminal leaf 12 is in turn bent roughly at a right-angle away from the connecting web 13, such that the retaining portion 11 clamps around the transverse rail.

Figure 5:
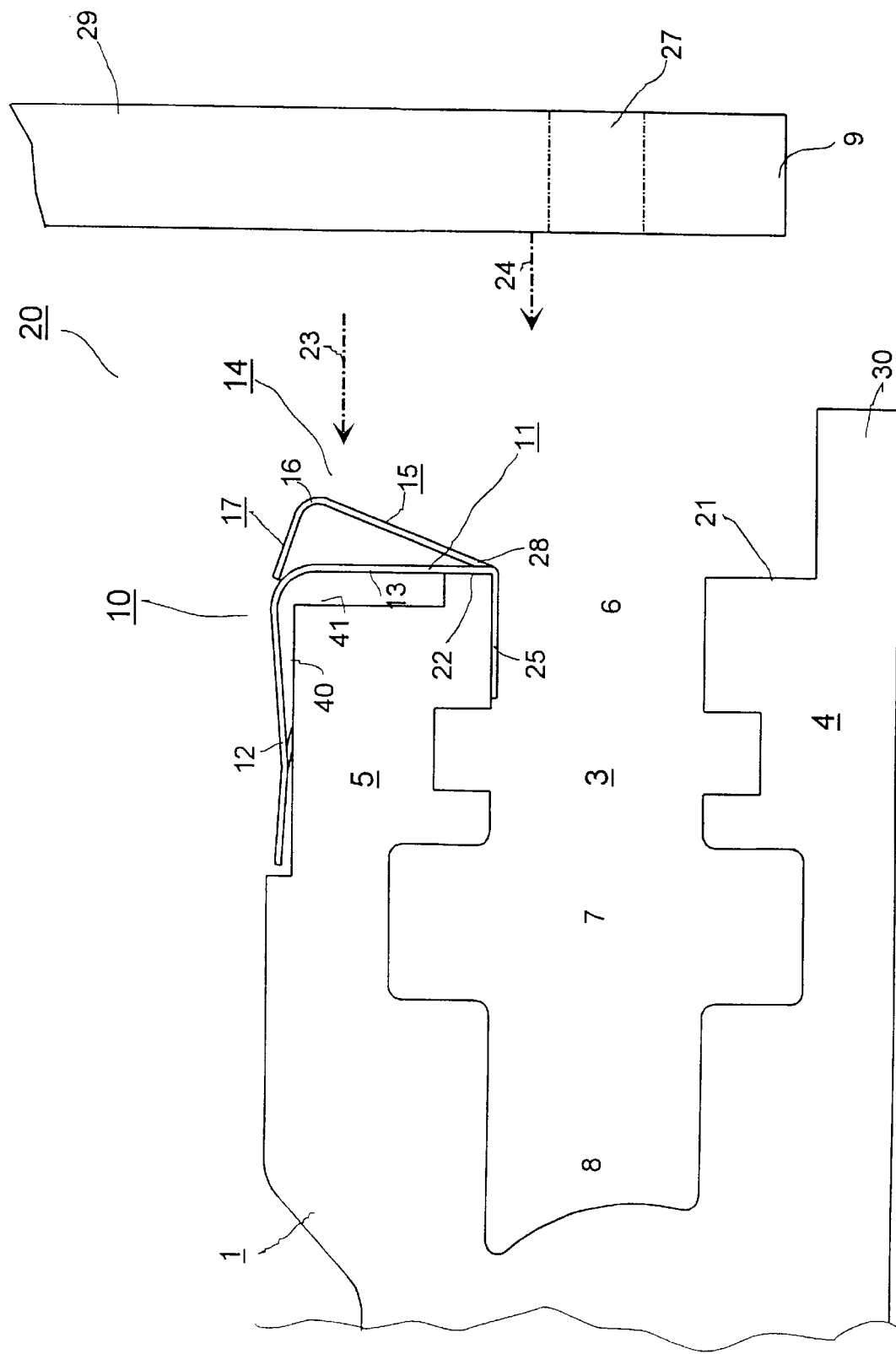
FIG. 5 shows a cross-section through a mounting rack in accordance with the invention, in the region of the lower transverse rail.

FIG. 5 shows a cross-section through a mounting rack according to the invention, in the region of the lower transverse rail 1. In the illustrated example, the lower transverse rail 1 has a transversely extending retaining groove 3, which is open toward the front 20 of the mounting rack. Retaining elements for the front element 29 of a printed circuit board assembly are able to engage in this retaining groove 3, such as, for example, the mounting screw 36 which is illustrated in the example in FIG. 3, shown passing through a corresponding hole 27 in the front element 29. The cross section of the retaining groove advantageously has a front, narrowed insertion region 6, which opens toward the front 20 of the mounting rack. A central, expanded retaining region 7, into which, e.g., a rail with threaded holes can be inserted, follows next in the direction of the groove base. The rail having the threaded holes is not illustrated in FIG. 5, for purposes of clarity. By way of example, the retaining groove 3 ends in a rear, narrowed compensation region 8, which is provided for receiving the ends of the threaded bolts of mounting screws which have been screwed into the mounting rack completely.

In the example shown in FIG. 5, the transverse retaining groove 3 is thus bounded by a lower and an upper boundary strip 4 and 5. Once the printed circuit board assembly has been completely inserted into the mounting rack in the direction of the arrow 24, the front element 29 thus rests against the end faces 21, 22 of the lower and upper boundary strips 4, 5 of the transverse retaining groove 3. In the example shown in FIG. 5, the preferably U-shaped retaining portion 11 of the spring contact strip 10 is preferably plugged onto the end face 22 of the inner boundary strip 5 of the transverse retaining groove 3 of the lower transverse rail 1. The contact spring 14 is thus forced to bend along the bending line 28 in the direction of the end face 22 of the boundary strip 5, as is indicated by the dashed-dotted arrow 23 in FIG. 5. To improve the contact, it is advantageous for the end face 22 not to be continuous, but to have a set-back recessed surface 41 behind the contact region 16 of the spring limb 15. The spring limb 15 can then be pressed in by the inner surface of the front element 29 to such an extent that electrically conductive contact is also made between the vertical connecting webs 13 in FIG. 5 and the inner surface of the front element 29. Finally, to improve the clamping effect and the retention robustness, it is advantageous to provide another recessed surface 40 on the surface of the boundary strip 5 facing the interior of the mounting rack. The terminal leaf 12 of the U-shaped retaining portion 11 is supported on this recessed surface by a friction joint.

Figure 6:
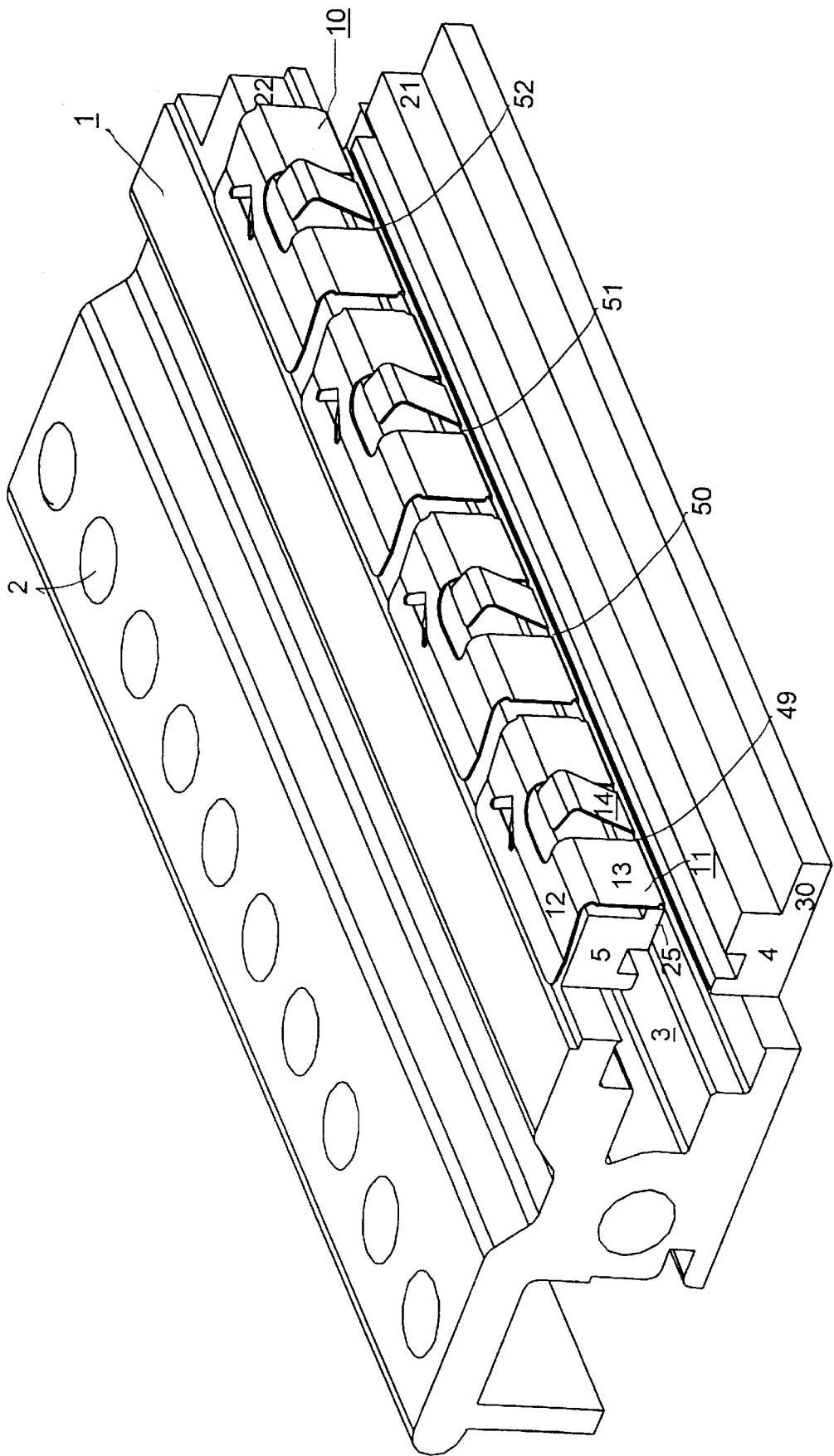
FIG. 6 shows a perspective plan view of the lower transverse rail of a mounting rack according to the invention and corresponding to the embodiment shown in FIG. 5.

FIG. 6 shows a perspective plan view of the lower transverse rail of a mounting rack in accordance with the invention and as shown in the configuration of FIG. 5. According to the invention, the contact springs 14 of the spring contact strip 10 are designed such that their spring movements run roughly parallel to the movement for inserting electrical printed circuit board assemblies into the mounting rack. The spring movement of the contact springs 14, which is toward the end face 22 of the upper boundary strip 5, runs roughly parallel to the movement for inserting electrical printed circuit board assemblies into the mounting rack. This configuration has the particular advantage that no transverse forces are exerted when the front elements are being pushed onto the spring contact strip 10. In fact, the spring contact strip 10 is loaded only by forces at right-angles to the strip body and the end face 22 (located underneath) of the upper boundary strip 5. This avoids potentially detrimental, permanent bending of the contact springs 14 and, in particular, of their spring limbs 15.

According to a further embodiment of the invention, the spring contact strip 10 in FIG. 6 is formed from individual spring segments of identical design. By way of example, FIG. 6 shows details of four spring segments 49, 50, 51 and 52. In this case, each spring segment has at least one retaining portion 11 and one contact spring 14. The retaining portions 11 are preferably U-shaped and each comprise at least one bearing strip 25, at least one vertical connecting web 13 and at least one terminal leaf 12. The elements 25 and 12 extend relative to the connecting web 13 roughly at right-angles. According to a further embodiment, which is also incorporated into FIG. 6, the bearing strips 25 associated with the angled contact springs 14 form an integral, continuous strip which rests against the lower surface of the upper boundary strip 5 along the entire length of the transverse rail 1.

FIG. 7 shows a perspective plan view of a detail of a preferred embodiment for a spring contact strip according to the invention and as shown in FIG. 6. In the example in FIG. 7, the preferably continuous bearing strip 25 rests against the inner surface of the upper boundary strip 5 that faces the retaining groove 3. Connecting webs are bent up roughly at a right-angle from the bearing strip 25. In the side view in FIG. 7, these webs are given the reference numbers 13 and 18 and rest against the end face 22 of the upper boundary strip 5. Terminal leaves 12, 42 are in turn bent roughly at a right-angle from the connecting webs 13, 18 and, in FIG. 7, rest on the outer surface of the upper boundary strip 5. A U-shaped clamping region is thus formed by the bearing strip 25, the connecting webs 13, 18 and the terminal leaves 12, 42. The contact springs 14 are advantageously bent back in the direction of the front (or rear) 20 of the mounting rack at the angled edge between the continuous bearing strip 25 and the connecting webs 13, 18.

In the example in FIG. 7, the contact spring segment 49 shown there advantageously has two adjacent connecting webs 13, 18, which are connected to one another in a U-shape via a transverse web 26. A contact spring 14 is arranged in the area between the connected connecting webs 13, 18. The fold edge 28 providing the spring action between a spring limb 15 and the preferably continuous bearing strip 25 is preferably disposed opposite the bridging transverse web 26. A contact spring 14 once again preferably includes a spring limb 15 which is angled off from the bearing strip 25 and which merges into a bent contact region extension 17 in order to form an adequate contact area 16. When the contact spring is stressed by a front panel resting against it, this extension 17 comes to rest in the region between two adjacent connecting webs 13, 18 which are connected via a transverse web 26.

The second recessed surface 41 on the end face 22 of the upper boundary strip 5, which is used to engage with the contact spring 14, has already being explained by means of the example in FIG. 5. This second recessed surface 41, together with the first recessed surface 40 (which is used to support the terminal leaf 12) on the top of the upper boundary strip 5 are shown in the embodiment of FIG. 7 as well. Toothed latching elements 19 are advantageously stamped out of the wall of a terminal leaf 42 and the transverse web 26 and are pressed in the direction of the top of the upper boundary strip 5. This allows the clamping effect to be improved between the preferably U-shaped retaining element 10 and the upper boundary strip 5 which is surrounded by it.

Figure 8A:
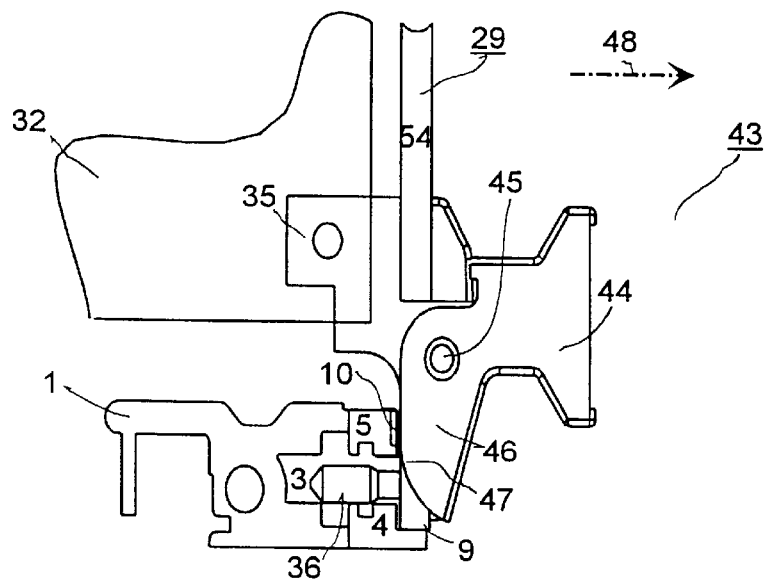
FIG. 8a shows a side view of a mounting rack in the region of the lower transverse rail, with a gripping lever fitted at the lower end of a front element, and with the associated assembly completely inserted in the mounting rack.

Finally, FIG. 8*a* shows a side view of a mounting rack in the region of the lower transverse rail 1, with the associated printed circuit board assembly 29 completely inserted into the mounting rack. In the example shown, the front element 29 of the printed circuit board assembly 32 has a gripping lever 43 at the lower end 9. Operation of this gripping lever 43 allows the printed circuit board assembly 32 to be levered at least out of the mounting rack. The gripping lever 43 has at least one grip 44, by means of which a supporting limb 46 can be pivoted about a fulcrum formed by a bearing journal 45. The gripping lever 43 and the front panel 54 of the front element 29 are connected to one another via a corner mounting piece 35. When the printed circuit board assembly 32 has been inserted completely, as is illustrated in FIG. 8*a*, e.g., the interior surface of the corner mounting piece 35 of the front element 29, rests electrically conductively on the spring contact strip 10. According to the invention, the gripping lever 43 has at least one curved levering surface 47. When the gripping lever 43 is operated to lever the printed circuit board assembly 32 out of the mounting rack, this curved levering surface 47 is supported on the lower transverse rail 1 and thus on the spring contact strip 10 fitted to it, and is configured to roll across the surface of the strip 10.

Figure 8B:
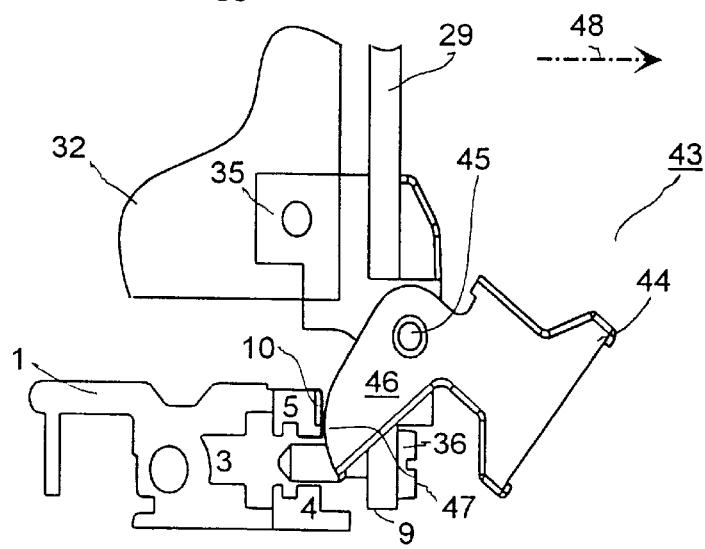
FIG 8b shows a side view corresponding to the illustration in FIG. 8a, showing the associated electrical printed circuit board assembly after it has been partially levered out of the mounting rack by operation of the gripping lever.
Figure 8C:
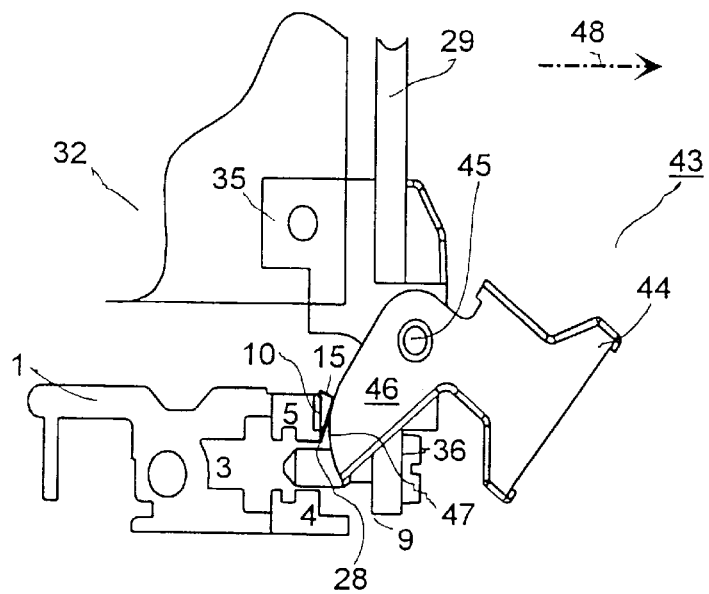
FIG. 8c shows a side view corresponding to the illustration in FIGS. 8a, 8b, in which the associated electrical printed circuit board assembly has been completely levered out of the mounting rack by operating the gripping lever.

FIG. 8b shows a side view corresponding to FIG. 8a, in which the electrical printed circuit board assembly 32 is partially levered out of the mounting rack by operation of the gripping lever 43. This is done by pushing the lever 43 downward to the pivoted position shown in FIG. 8b. As a result of the pressing and rolling operation of the levering surface 47, the electrical printed circuit board assembly 32 is moved out of the mounting rack in the direction of the dashed-dotted arrow 48. The particularly advantageous design of the spring contact strip 10 of the mounting rack according to the invention means that such a levering-out process produces no deformation or damage whatsoever to the spring contact strip 10. Finally, FIG. 8c shows a side view corresponding to the illustrations in FIGS. 8a, 8b, in which the associated electrical printed circuit board assembly is completely levered out of the mounting rack by operation of the gripping lever 43. The spring limb 15 of the contact spring 14 has here once again assumed the unloaded state, where it extends out from the remainder of the contact strip 10 completely.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. A mounting rack for holding at least one electrical printed circuit board assembly, the mounting rack having an interior and a front face and comprising:
   a) electrically conductive transverse rails provided at least on the front face and between which the printed circuit board assembly is inserted;
   b) at least one electrically conductive front element connected to the printed circuit board assembly and having a longitudinal side extending in a longitudinal direction; and
   c) at least one spring contact strip, said spring contact strip comprising:
      c1) at least one retaining portion securing said spring contact strip on an end face, facing said front element, of at least one of said transverse rails; and
      c2) at least one contact spring connected to said retaining portion and comprising a spring limb which is angled off from said retaining portion along a longitudinal edge that extends generally perpendicularly to the longitudinal side of said front element and which extends in a direction generally away from the mounting rack interior, wherein
         c21) additionally said spring limb extends from said retaining portion in generally the longitudinal direction of the longitudinal side of said front element;
         c22) said spring limb exhibits spring movements in directions that approximately coincide respectively with directions of insertion and withdrawal movements of the printed circuit board assembly into and out of the mounting rack interior; and
         c23) said spring limb retracts at least substantially into said retaining portion when said spring limb is pressed fully in the direction of insertion movement of the printed circuit board assembly.

2. A mounting rack as claimed in claim 1, wherein:
said transverse rails and said spring contact strip extend in a horizontal direction;
said front element and the printed circuit board assembly extend in a vertical direction, the vertical direction coinciding with the longitudinal direction of the longitudinal side of said front element; and
said transverse rails and said spring contact strip extend in the horizontal direction sufficiently to receive further printed circuit board assemblies between said transverse rails horizontally alongside the one printed circuit board assembly.

3. The mounting rack as claimed in claim 1, wherein:
said spring limb comprises:
   a) a first limb end proximate to said at least one transverse rail
   b) a second limb end distant from said at least one transverse rail and extending from said first limb end; and
   c) a contact region extending from said second limb end and configured to contact with an interior surface of said front element.

4. The mounting rack as claimed in claim 3, wherein said contact region is curved.

5. The mounting rack as claimed in claim 3, wherein said spring limb further comprises:
   d) a contact region extension extending from said contact region in a direction generally toward said at least one transverse rail.

6. The mounting rack as claimed in claim 1, wherein said retaining portion of said spring contact strip has a generally U-shaped cross-section and is configured to clamp onto the end face of said at least one transverse rail.

7. The mounting rack as claimed in claim 6, wherein said at least one transverse rail comprises:
   a) a transversely extending first boundary strip located on the end face of said at least one transverse rail on a side that is proximate to the mounting rack interior; and
   b) a transversely extending second boundary strip located on the end face of said at least one transverse rail on a side that is proximate to an exterior of the mounting rack; and
   wherein said retaining portion is clamped onto said first boundary strip.

8. The mounting rack as claimed in claim 7, wherein:
said front element comprises a plurality of retaining elements for affixing said front element to said at least one transverse rail; and
said first and second boundary strips form at least one transversely extending retaining groove configured to receive and engage said retaining elements.

9. The mounting rack as claimed in claim 7, wherein said retaining portion comprises:
   a) a bearing strip having the longitudinal edge from which said spring limb of said contact spring is angled off;
   b) connecting webs extending at approximately a right-angle from said bearing strip and resting on the end face of said at least one transverse rail; and
   c) terminal leaves extending at approximately a right-angle from said connecting webs;

whereby said retaining portion embraces said first boundary strip of said at least one transverse rail.

10. The mounting rack as claimed in claim 6, wherein:

said retaining portion comprises at least two clips embracing at least a portion of said at least one transverse rail and a transverse web connecting said clips; and said contact spring is provided between said two clips and retracts into said retaining portion between said two clips.

11. The mounting rack as claimed in claim 6, wherein said retaining portion comprises a bearing strip having the longitudinal edge from which said spring limb of said contact spring is angled off.

12. The mounting rack as claimed in claim 11, wherein:

said bearing strip extends continuously along essentially an entire length of said at least one transverse rail; and said spring contact strip has further spring limbs in addition to said spring limb angled off from the longitudinal edge of said bearing strip.

13. The mounting rack as claimed in claim 11, wherein said retaining portion further comprises:

a) connecting webs extending at approximately a right-angle from said bearing strip and resting on the end face of said at least one transverse rail; and b) terminal leaves extending at approximately a right-angle from said connecting webs;

whereby said retaining portion embraces at least a portion of said at least one transverse rail.

14. The mounting rack as claimed in claim 13, wherein:

said retaining portion further comprises a transverse web connecting said terminal leaves; and said spring limb is angled off from the longitudinal edge of said bearing strip between said connecting webs and retracts into said retaining portion between said connecting webs.

15. The mounting rack as claimed in claim 13, wherein said spring limb is angled off from the longitudinal edge of said bearing strip between said connecting webs, and said spring limb retracts into said retaining portion between said connecting webs.

16. The mounting rack as claimed in claim 1, further comprising:

a gripping lever fitted at a longitudinal end of said front element, for levering out the printed circuit board assembly, wherein said gripping lever comprises at least one curved pressure surface oriented and configured to press against and roll over said spring contact strip when said gripping lever is operated to lever the printed circuit board assembly out of the mounting rack interior.

17. A mounting rack, comprising:

an electrically conductive transverse rail;

an electrically conductive spring contact piece mounted on an end face of said transverse rail; and a detachable, electrically conductive element resting under pressure against said spring contact piece when fully inserted in the mounting rack;

wherein said spring contact piece comprises:

a first portion comprising limbs that secure said spring contact piece to said transverse rail; and a second portion exhibiting spring action between a rest position, in which said second portion is angled away, along an edge that extends along said transverse rail, from said first portion and away from the end face of said transverse rail, and a tensioned position, in which said second portion is retracted toward said first portion and into the end face of said transverse rail.

18. The mounting rack as claimed in claim 17, wherein:

said second portion is located centrally in said spring contact piece; and said first portion frames said second portion on at least two opposite lateral sides of said spring contact piece.

19. The mounting rack as claimed in claim 17, further comprising:

at least two additional spring contact pieces mounted on the end face of said transverse rail; and an electrically conductive strip interconnecting said spring contact piece with said at least two additional spring contact pieces.

20. A spring contact strip, comprising:

a plurality of electrically conductive spring contact elements; and a conductive strip extending in a lengthwise direction and interconnecting said plurality of spring contact elements;

wherein each of said plurality of spring contact elements comprises:

a first contact surface;

at least one securing limb extending from said first contact surface in a first direction, wherein said securing limb is configured to engage a transverse rail of a mounting rack for printed circuit board assemblies; and a second contact surface that is angled away from said first contact surface along a folding edge that extends along the lengthwise direction and that exhibits spring action between a rest position, in which said second contact surface extends away from said first contact surface in a second direction opposite the first direction, and a tensioned position, in which said second contact surface is retracted in the first direction to form a substantially planar contact surface with the first contact surface.

21. The spring contact strip according to claim 20, wherein said first contact surface extends at a first angle along the first folding edge from said conductive strip;

said securing limb extends at a second angle along a second folding edge from said first contact surface; and said second contact surface extends at a third angle along the first folding edge from said conductive strip.

* * * * *